US012764916B2

(12) United States Patent
Son

(10) Patent No.: US 12,764,916 B2
(45) Date of Patent: Oct. 13, 2026

(54) DISPLAY DEVICE

(71) Applicant: LG Display Co., Ltd., Seoul (KR)

(72) Inventor: Sungsik Son, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 169 days.

(21) Appl. No.: 18/532,200

(22) Filed: Dec. 7, 2023

(65) Prior Publication Data

US 2024/0196576 A1 Jun. 13, 2024

(30) Foreign Application Priority Data

Dec. 8, 2022 (KR) ........................ 10-2022-0170557

(51) Int. Cl.

*H05K 7/20* (2006.01)
*H10K 59/126* (2023.01)
*H10K 59/95* (2023.01)
*H10K 102/00* (2023.01)

(52) U.S. Cl.

CPC ....... *H05K 7/20963* (2013.01); *H10K 59/126* (2023.02); *H10K 59/95* (2023.02); *H10K 2102/361* (2023.02)

(58) Field of Classification Search

CPC .................................................. H05K 7/20963
See application file for complete search history.

(56) References Cited

U.S. PATENT DOCUMENTS 8,941,555 B2 1/2015 Yoo
11,678,512 B2 6/2023 Ham et al.
2018/0206350 A1 7/2018 Kim et al.
2020/0245501 A1 7/2020 Wu et al.
2022/0374058 A1 11/2022 Kim et al.
2022/0375880 A1* 11/2022 Kim .................... H10D 86/441
2024/0298429 A1 9/2024 Chen

FOREIGN PATENT DOCUMENTS

CN 113436538 A 9/2021
CN 113870714 A 12/2021
CN 217718922 U 11/2022
JP 2010-128049 A 6/2010
KR 2014-0003995 A 1/2014

(Continued)

OTHER PUBLICATIONS

WO 2019076081 A1, translation (Year: 2019).*

(Continued)

*Primary Examiner* — Mukundbhai G Patel
(74) *Attorney, Agent, or Firm* — Fish & Richardson P.C.

(57) ABSTRACT

A display device includes a cover window; a first display module and a second display module attached to a lower surface of the cover window; a heat-dissipating plate attached to the first display module and the second display module; and a core plate disposed under the cover window and configured to receive the first display module, the second display module, and the heat-dissipating plate thereon, wherein a heat-dissipating plate includes: a first flat portion attached to the first display module; a second flat portion attached to the second display module; and a bridge connecting the first flat portion and the second flat portion to each other and having a shape different from a shape of each of the first flat portion and the second flat portion.

14 Claims, 3 Drawing Sheets

(56) References Cited

FOREIGN PATENT DOCUMENTS

| | | | | | |
|---|---|---|---|---|---|
| KR | 20210016223 | A | | 2/2021 | |
| KR | 10-2021-0079836 | A | | 6/2021 | |
| KR | 20220065976 | A | | 5/2022 | |
| WO | WO-2019076081 | A1 | * | 4/2019 | ......... H05K 7/20963 |
| WO | WO-2023282661 | A1 | * | 1/2023 | ......... H05K 7/20963 |

OTHER PUBLICATIONS

WO 2023282661 A1, translation (Year: 2023).*
Notice of Allowance in Korean Appln. No. 10-2022-0170557, mailed on Aug. 16, 2026, 3 pages (with English translation).

* cited by examiner

DISPLAY DEVICE

CROSS-REFERENCE TO RELATED APPLICATION

This application claims the priority of Korean Patent Application No. 10-2022-0170557 filed on Dec. 8, 2022, which is hereby incorporated by reference in its entirety.

BACKGROUND

Field of the Disclosure

The present disclosure relates to a display device, and more particularly, to a display device in which a plurality of display panels are included, and in which heat-dissipating ability and reliability may be improved.

Description of the Background

A liquid crystal display device (LCD), an organic light-emitting diode display device, an inorganic light-emitting diode display device, and a quantum dot display device (QD) as a flat panel display device are in the limelight.

Recently, a flexible display device in which a display panel is bendable, foldable, or rollable into a curved surface has been developed. The flexible display device may be used in a wide variety of information devices such as televisions, monitors, smartphones, tablet PCs, notebooks, and wearable devices.

Further, various vehicle display devices such as a digital dashboard (or cluster), a central information display (CID), and a rear seat entertainment (RSE) display are being used. Attempts are being made to apply the flexible display device that may be implemented in various shapes to these vehicle display devices, or to integrate the digital dashboard and the central information display into a single display.

SUMMARY

In this context, a display device in which a plurality of display panels are disposed under one cover window has been developed.

When the display device operates, a lot of heat is generated in the display panel. When the heat generated from the display panel is not effectively dissipated to the outside, a lifetime of the display panel may be shortened. In particular, when the display panel is embodied as an organic light-emitting diode display panel, the display panel is more vulnerable to the heat.

A heat-dissipating plate is attached to each display panel to dissipate the heat generated from the display panel to the outside. In the display device in which the plurality of display panels are disposed under one cover window, a process of attaching the heat-dissipating plate thereto is performed as many times as the number of display panels.

Accordingly, the present disclosure is to provide a heat-dissipating plate capable of reducing the number of heat-dissipating plate attachment processes and improving the heat-dissipating ability, and a display device to which the heat-dissipating plate is applied.

The present disclosure is also to provide a display device in which a plurality of display panels are included, and in which heat-dissipating ability and reliability may be improved while the number of heat-dissipating plate attachment processes is reduced.

The present disclosure is not limited to the above-mentioned features. Other advantages according to the present disclosure that are not mentioned may be understood based on following descriptions, and may be more clearly understood based on aspects according to the present disclosure. Further, it will be easily understood that the purposes and advantages according to the present disclosure may be realized using means shown in the claims or combinations thereof.

A display device according to one aspect of the present disclosure includes a cover window; a first display module and a second display module attached to a lower surface of the cover window; a heat-dissipating plate attached to the first display module and the second display module; and a core plate disposed under the cover window and configured to receive the first display module, the second display module, and the heat-dissipating plate thereon, wherein a heat-dissipating plate includes: a first flat portion attached to the first display module; a second flat portion attached to the second display module; and a bridge connecting the first flat portion and the second flat portion to each other and having a shape different from a shape of each of the first flat portion and the second flat portion.

A display device according to another aspect of the present disclosure includes a plurality of display modules, each including a display panel and a support plate disposed under the display panel; and a heat-dissipating plate attached to the support plates of the plurality of display module, wherein the heat-dissipating plate includes: flat portions respectively attached to the plurality of display modules; and at least one bridge connecting adjacent ones of the flat portions to each other, wherein the at least one bridge is bent from the flat portions to form a step structure.

Details of the other aspects are included in the detailed descriptions and drawings.

According to the aspects of the present disclosure, the first flat portion attached to the first display module and the second flat portion attached to the second display module are connected by the bridge to form an integrated heat-dissipating plate. Thus, compared to separately attaching the heat-dissipating plate to each of the first and the second display modules, the number of parts and the number of processes may be reduced, and a manufacturing time of the display device may be shortened.

According to the aspects of the present disclosure, the heat-dissipating plate further includes not only the first flat portion and the second flat portion but also the bridge. Thus, the heat-dissipating area may be increased, such that more efficient heat dissipation may be achieved. Therefore, degradation of the organic light-emitting elements within the display panel may be prevented, and thus, the lifespan of the display device may be extended.

According to the aspects of the present disclosure, the bridge having a step structure bent from the first flat plate portion and the second flat plate portion of the heat dissipation plate toward the cover window is provided. Further, the plurality of through-holes may be defined in the bridge. Thus, even when expansion and contraction of the heat-dissipating plate occurs during reliability evaluation or use of the display device, the shock due to the expansion and contraction of the heat-dissipating plate may be absorbed by the bridge such that the damage to the display device may be prevented and reliability of the display device may be improved.

According to the aspects of the present disclosure, the protrusion of the core plate is brought into contact with the bridge of the heat-dissipating plate, such that the heat transfer is achieved based on conduction. Thus, not only the heat-dissipating through the air gap between the core plate and the heat-dissipating plate may be achieved, but also an additional heat-dissipating path via the contact between the protrusion of the core plate and the bridge of the heat-dissipating plate may be generated, so that the heat may dissipates more effectively. Accordingly, when the display panel is embodied as the organic light-emitting diode display panel, the deterioration of the organic light-emitting elements may be suppressed such that the lifetime of the display device may be extended.

Effects of the present disclosure are not limited to the effects mentioned above, and other effects not mentioned will be clearly understood by those skilled in the art from the descriptions below.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
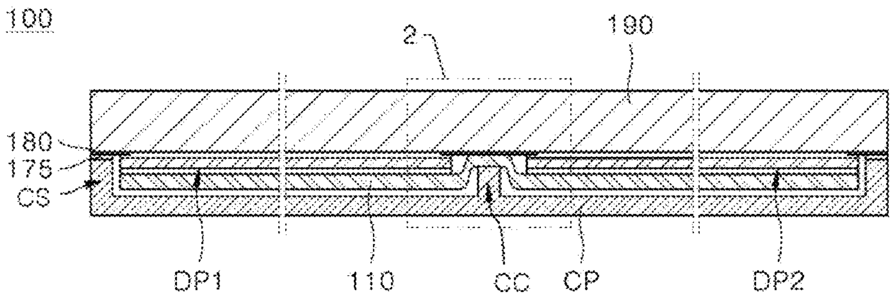
FIG. 1 is a cross-sectional view showing a display device according to one aspect of the present disclosure.

Advantages and features of the present disclosure, and a method of achieving the advantages and features will become apparent with reference to aspects described later in detail together with the accompanying drawings. However, the present disclosure is not limited to the aspects as disclosed under, but may be implemented in various different forms. Thus, these aspects are set forth only to make the present disclosure complete, and to completely inform the scope of the present disclosure to those of ordinary skill in the technical field to which the present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various aspects are illustrated and described further below. It will be understood that the description herein is not intended to limit the claims to the specific aspects described. On the contrary, it is intended to cover alternatives, modifications, and equivalents as may be included in the spirit and scope of the present disclosure as defined by the appended claims.

A shape, a size, a ratio, an angle, a number, etc. disclosed in the drawings for describing aspects of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular aspects only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after," "subsequent to," "before," etc., another event may occur therebetween unless "directly after," "directly subsequent" or "directly before" is indicated.

When a certain aspect may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various aspects of the present disclosure may be partially or entirely combined with each other, and may be technically associated with each other or operate with each other. The aspects may be implemented independently of each other and may be implemented together in an association relationship.

In interpreting a numerical value, the value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "aspects," "examples," "aspects, and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing aspects.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, a display device according to aspects of the present disclosure will be described in detail with reference to the accompanying drawings.

Figure 2:
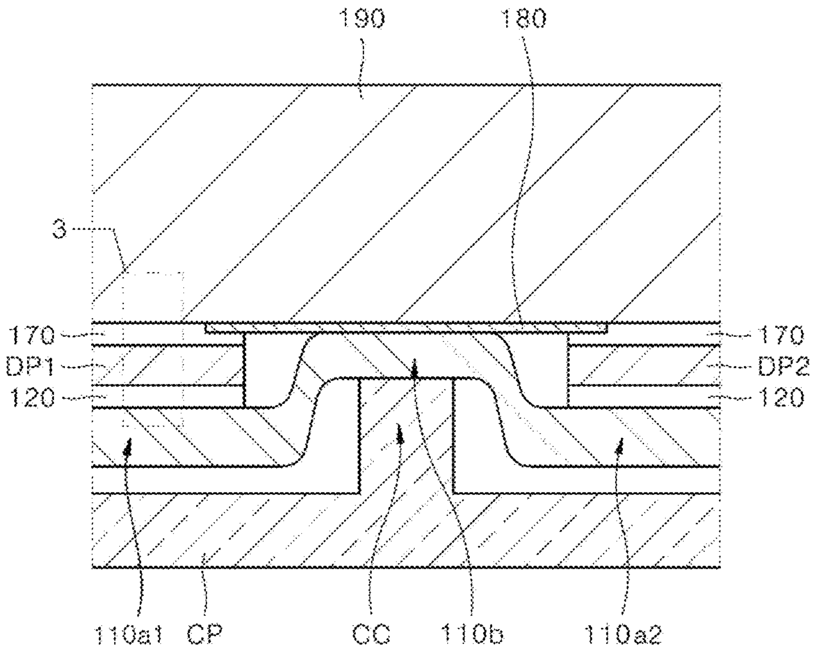
FIG. 2 is an enlarged view showing a portion of FIG. 1.
Figure 3:
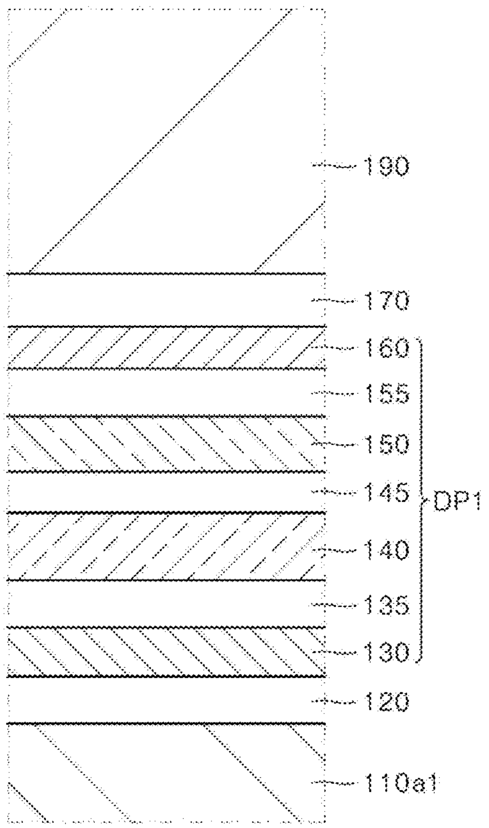
FIG. 3 is an enlarged view showing a portion of FIG. 2.
Figure 4:
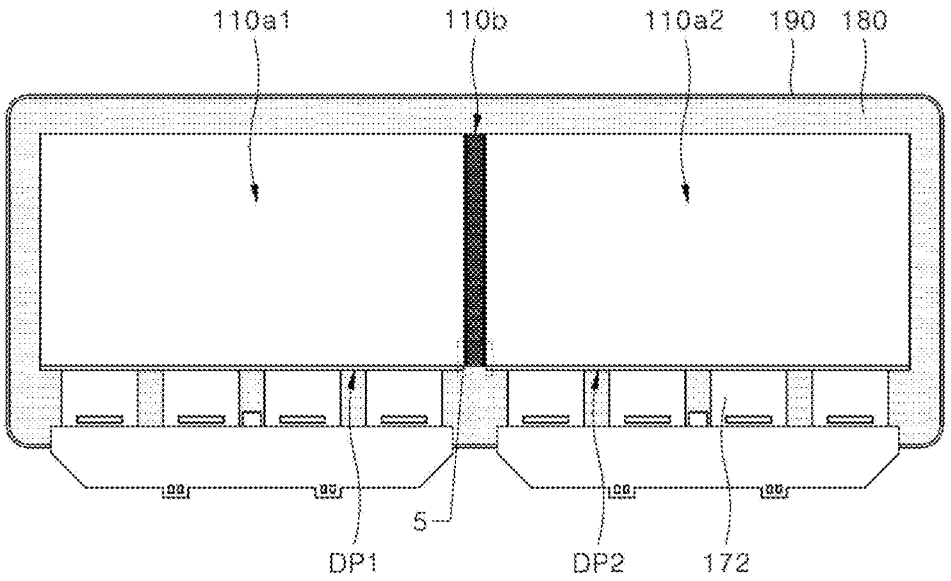
FIG. 4 is a rear view of a display device according to one aspect of the present disclosure.
Figure 5:
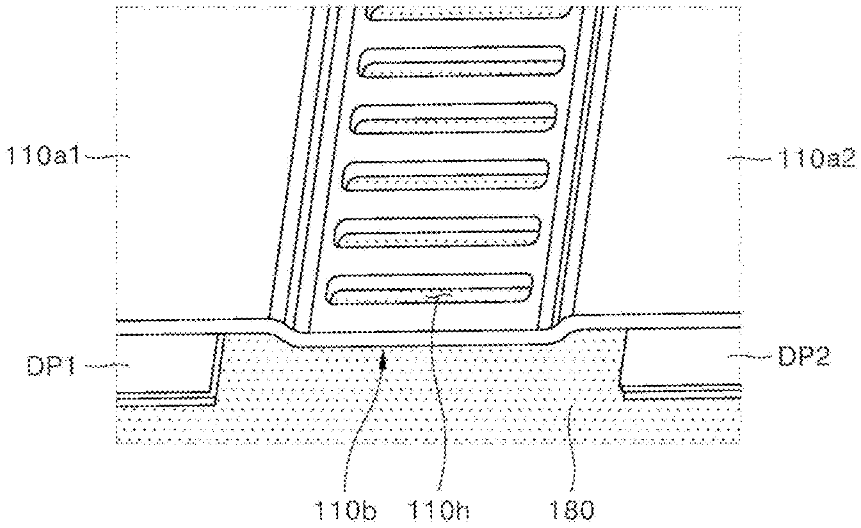
FIG. 5 is an enlarged view of a portion of FIG. 4, and shows a bridge of a support plate according to one aspect of the present disclosure.

FIG. 1 is a cross-sectional view showing a display device according to one aspect of the present disclosure. FIG. 2 is an enlarged view showing a portion of FIG. 1. FIG. 3 is an enlarged view showing a portion of FIG. 2, and shows a configuration of a display module. FIG. 4 is a rear view of a display device according to one aspect of the present disclosure, and shows a state in which a core plate is removed. FIG. 5 is an enlarged view of a portion of FIG. 4, and shows a bridge of a heat-dissipating plate according to one aspect of the present disclosure.

Referring to FIG. 1 to FIG. 5, a display device 100 according to an aspect of the present disclosure may include a cover window 190, a plurality of display modules DP1 and DP2, a heat-dissipating plate 110, and a core plate CP. The plurality of display modules DP1 and DP2 may be attached to the heat-dissipating plate 110 and the cover window 190 via adhesive layers 120 and 170, respectively.

Although the display device 100 is illustrated as including two display modules DP1 and DP2 attached to one cover window 190, the display device 100 may include three or more display modules attached to one cover window 190.

The cover window 190 may be made of a transparent material so that light emitted from the plurality of display modules DP1 and DP2 may transmit therethrough. Components of the display modules DP1 and DP2 may be protected from external impact, moisture, and heat by the cover window 190. The cover window 190 may be made of transparent glass or transparent plastic material.

A light-blocking layer 180 may be disposed on a lower surface of the cover window 190. The light-blocking layer 180 may be disposed in an edge area of the cover window 190 and an inner area of the cover window 190 positioned between the plurality of display modules DP1 and DP2. The light-blocking layer 180 may overlap a non-display area of each of the plurality of display modules DP1 and DP2, so that various lines disposed in the non-display area of each of the plurality of display modules DP1 and DP2 may be prevented from being visually recognized by the viewer. The light-blocking layer 180 may be disposed to overlap a bridge 110*b* of the heat-dissipating plate 110 disposed between the plurality of display modules DP1 and DP2 such that the bridge 110*b* of the heat-dissipating plate 110 disposed between the plurality of display modules DP1 and DP2 may be prevented from being visually recognized by the viewer. The light-blocking layer 180 may be formed, for example, by coating black ink and then curing the same, and may have a width larger than a width of the bridge 110*b* to overlap a portion of each of the plurality of display modules DP1 and DP2.

The adhesive layer 170 between the lower surface of the cover window 190 and the plurality of display modules DP1 and DP2 may cover an edge of the light-blocking layer 180. Further, a hard coating layer may be additionally formed on an upper surface of the cover window 190.

The adhesive layer 170 between the lower surface of the cover window 190 and the plurality of display modules DP1 and DP2 may be an adhesive member including an optical clear adhesive (OCA) or the like.

The first display module DP1 and the second display module DP2 may include the same components as each other. Each of the first display module DP1 and the second display module DP2 may include, for example, a support plate 130, a display panel 140, a polarizer 150, and a touch panel 160. FIG. 3 shows a stack structure of the components of the first display module DP1. However, the second display module DP2 may have the same stack structure as that of the first display module DP1.

The support plate 130 may be attached to a lower surface of the display panel 140 via an adhesive layer 135. The polarizer 150 may be attached to an upper surface of the display panel 140 via an adhesive layer 145. The touch panel 160 may be attached to an upper surface of the polarizer 150 via an adhesive layer 155.

The display panel 140 may be a flexible display panel. For example, the display panel 140 may be an organic light-emitting diode display panel formed on a flexible substrate. However, the present disclosure is not limited thereto. The display panel 140 may be of various types, such as a liquid crystal display panel, an inorganic light-emitting diode display panel, and a quantum dot display panel. When the display panel 140 is embodied as the organic light-emitting diode display panel, the display panel 140 may include a thin-film transistor array in which thin-film transistors (including switching thin-film transistors and driving thin-film transistors) are formed on the flexible substrate and in each pixel, an organic light-emitting element disposed in each pixel and connected to the driving thin-film transistor, and an encapsulation layer covering the organic light-emitting elements to prevent moisture and oxygen from the outside from invading the organic light-emitting elements.

The polarizer 150 may be disposed on the display panel 140 to prevent reflection of light introduced from the outside to provide a function of improving visibility of the display panel 140. The polarizer 150 may include a polarizer and a phase retardation layer. The adhesive layer 145 may be an adhesive member including an optical clear adhesive (OCA) or the like.

The touch panel 160 may be disposed between the cover window 190 and the polarizer 150. The touch panel 160 may provide a touch function for detecting a touch input such as a stylus pen or a user's finger. The adhesive layer 145 bonding the touch panel 160 and the cover window 190 to each other may be an adhesive member including an optical clear adhesive (OCA) or the like.

In one aspect, instead of disposing the touch panel 160 on the polarizer 150, a touch electrode necessary for touch recognition may be disposed on the encapsulation layer of the display panel 140.

Each of the first display module DP1 and the second display module DP2 may further include a light control film disposed on the touch panel 160. The light control film may adjust a propagation angle of light emitted from the display panel 140 to a vertical direction or a left and right direction to prevent a viewing angle from being increased in an unnecessary direction. The light control film may be attached onto the touch panel 160 via an adhesive member including an optical clear adhesive (OCA) or the like. In an aspect in which the touch electrode required for touch recognition instead of the touch panel 160 is disposed on the encapsulation layer of the display panel 140, the light control film may be attached to the polarizer 150 via an adhesive member including optical clear adhesive (OCA), etc.

The support plate 130 is attached to the lower surface of the display panel 140 via an adhesive layer 135 to support the display panel 140. The support plate 130 may be made of, for example, a polymer material. The polymer material may include, for example, polymethylmethacrylate (PMMA), polycarbonate (PC), polyacrylate (PA), polyvinylalcohol (PVA), acrylonitrile-butadiene-styrene (ABS), polyethylene terephthalate (PET), or polyimide (PI). However, the present disclosure is not limited thereto. The adhesive layer 135 may be an adhesive member including an optical clear adhesive (OCA) or the like.

When the display panel 140 is embodied as an organic light-emitting diode display panel, the organic light-emitting elements may be deteriorated due to heat generated during operation of the display panel. Thus, it is important to dissipate the heat to the outside. Thus, the heat-dissipating plate 110 may be attached to the first display module DP1 and the second display module DP2 to dissipate the heat generated from the display panel 140 to the outside.

The adhesive layer 120 may be disposed between the first display module DP1 and the heat-dissipating plate 110 and between the second display module DP2 and the heat-dissipating plate 110.

The heat-dissipating plate 110 may include a first flat portion **110*al* attached to a lower surface of the first display module DP1, a second flat portion 110*a*2 attached to a lower surface of the second display module DP2, and the bridge 110*b* connecting the first flat portion 110*al* and the second flat portion 110*a*2 to each other. The bridge 110*b* may be formed in a step structure bent toward the cover window 190 from the first flat portion 110*al* and the second flat portion 110*a*2. The bridge 110*b* may contact the light-blocking layer 180 disposed on the lower surface of the cover window 190. An adhesive layer is not present between the light-blocking layer 180 disposed on the lower surface of the cover window 190 and the bridge 110*b* of the heat-dissipating plate 110**.

As shown in FIG. 1 and FIG. 2, the bridge **110*b* may be formed in a one-step structure. However, the present disclosure is not limited thereto. In some aspects, the bridge 110*b*** may be formed in a two or more-steps structure.

The bridge **110*b* of the heat-dissipating plate 110 may have a plurality of through-holes 110*h* defined therein. The bridge 110*b* may have a long shape with a narrow width. Each of the plurality of through-holes 110*h* may extend in a width direction of the bridge 110*b*. The plurality of through-holes 110*h* may be spaced apart from each other and may be arranged in a length direction of the bridge 110*b*. The width direction of the bridge 110*b* may refer to a direction from the first display module DP1 to the second display module DP2 or from the second display module DP2 to the first display module DP1**. The length direction is perpendicular to the width direction.

Figure 6:
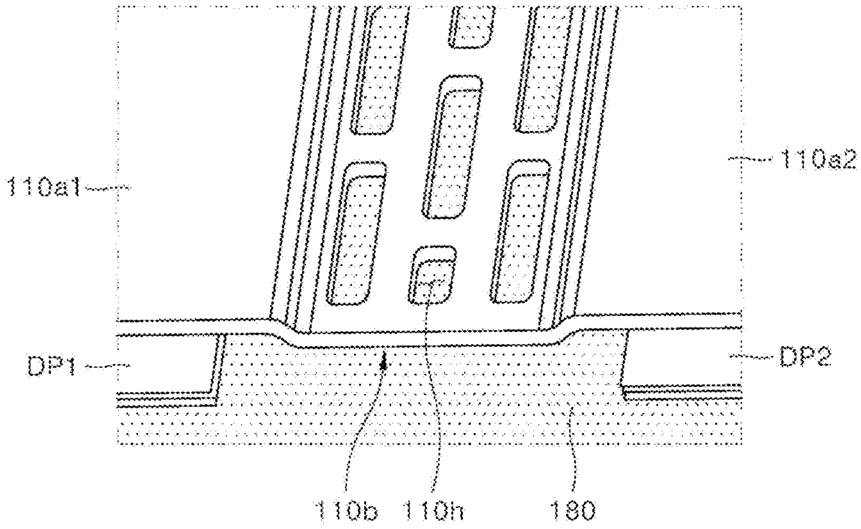
FIG. 6 shows a bridge of a support plate according to another aspect of the present disclosure.

The shape and arrangement of the plurality of through-holes **110*h* are not limited to those shown in FIG. 5. For example, as shown in FIG. 6, each of the plurality of through-holes 110*h* may have a predetermined width and may extend in the length direction, and the plurality of through-holes may be arranged to be spaced apart from each other in the length direction and the width direction. Alternatively, each of the plurality of through-holes 110*h* may have a cross shape or the plurality of through-holes 110*h*** may be arranged in a zigzag manner.

The heat-dissipating plate 110 may be made of a metal, for example, gold (Au), silver (Ag), magnesium (Mg), aluminum (Al) or copper (Cu). However, the material of the heat-dissipating plate 110 is not limited thereto. The heat-dissipating plate 110 may be made of any one of carbon fiber, graphite, and graphene having excellent thermal conductivity, or a combination thereof. The adhesive layer 120 disposed between the plurality of display modules DP1 and DP2 and the heat-dissipating plate 110 may be an adhesive member including optical clear adhesive (OCA), a double-sided tape, etc., and may further include a thermally conductive material.

In this aspect, the bridge 110*b* may connect the first flat portion 110*al* attached to the first display module DP1 and the second flat portion 110*a*2 attached to the second display module DP2 to each other to form an integrated heat-dissipating plate 110. For example, the first flat portion 110*a*1, the second flat portion 110*a*2 and the bridge 110*b* may be integrally formed by patterning a single metal plate. Thus, compared to separately attaching the heat-dissipating plate to each of the first and the second display modules DP1 and DP2, the number of parts and the number of processes may be reduced. Thus, a manufacturing time of the display device may be shortened.

Further, the heat-dissipating plate 110 may include the bridge 110*b* together with the first flat portion 110*al* and the second flat portion 110*a*2. Thus, a heat-dissipating area may be increased, such that more efficient heat dissipation may be achieved. Accordingly, when the display panel 140 is embodied as the organic light-emitting diode display panel, deterioration of the organic light-emitting elements may be prevented to extend the lifetime of the display device.

If the heat-dissipating plate 110 attached to the first display module DP1 and the second display module DP2 is formed in a simple flat plate shape, damage may be applied to the display device 100 due to expansion and contraction of the heat-dissipating plate 110 during reliability evaluation or use of the display device 100.

However, in this aspect, the bridge 110*b* may be formed in the step structure bent toward the cover window 190 from the first display module DP1 and the second flat portion 110*a*2. Further, the plurality of through-holes 110*h* may be defined in the bridge 110*b*. Thus, even when expansion and contraction of the heat-dissipating plate 110 occurs during reliability evaluation or use of the display device 100, the shock due to the expansion and contraction of the heat-dissipating plate 110 may be absorbed by the bridge 110*b* such that the damage to the display device 100 may be prevented.

The core plate CP may receive thereon the plurality of display modules DP1 and DP2 and the heat-dissipating plate 110. A sidewall CS of the core plate CP which defines a space for receiving the plurality of display modules DP1 and DP2 and the heat-dissipating plate 110 therein may overlap the light-blocking layer 180 formed on the edge of the lower surface of the cover window 190 and be attached the light-blocking layer 180 via the adhesive layer 175.

The core plate CP may include a protrusion CC supporting the bridge 110*b* of the heat-dissipating plate 110 while being in contact with the bridge 110*b* of the heat-dissipating plate 110. A height of each of the protrusion CC of the core plate CP and the sidewall CS thereof may be designed such that an air gap is defined between the core plate CP and the heat-dissipating plate 110 in an area other than an area where the bridge 110*b* of the heat-dissipating plate 110 and the protrusion CC of the core plate CP contact each other. When the air gap is defined between the core plate CP and the heat-dissipating plate 110, the damage to the display modules DP1 and PD2 due to pressing of the core plate CP when the core plate CP is attached thereto, or when the external impact is applied may be prevented.

The core plate CP may be made of a metal having excellent thermal conductivity, such as gold (Au), silver (Ag), copper (Cu), aluminum (Al), or magnesium (Mg). The adhesive layer 175 may be an adhesive member including an optical clear adhesive (OCA) or the like.

The heat discharged from the heat-dissipating plate 110 may be transferred to the core plate CP and then may be discharged therefrom to the outside. When the protrusion CC of the core plate CP is brought into contact with the bridge 110*b* of the heat-dissipating plate 110, the heat transfer is achieved based on conduction. Thus, not only the heat-dissipating through the air gap between the core plate CP and the heat-dissipating plate 110 may be achieved, but also an additional heat-dissipating path via the contact between the protrusion CC of the core plate CP and the bridge 110*b* of the heat-dissipating plate 110 may be generated, so that the heat dissipates more effectively. Accordingly, when the display panel 140 is embodied as the organic light-emitting diode display panel, the deterioration of the organic light-emitting elements may be suppressed such that the lifetime of the display device may be extended.

Each control module 172 for controlling the display panel 140 may be connected to each of the first display module DP1 and the second display module DP2. The control module 172 may include a flexible circuit film on which driver chips are mounted and a printed circuit board connected thereto.

The printed circuit board of the control module 172 may be disposed on a back side of the core plate CP.

A display device according to aspects of the present disclosure may be described as follows.

A first aspect of the present disclosure provides a display device comprising: a cover window; a first display module and a second display module attached to a lower surface of the cover window; a heat-dissipating plate attached to the first display module and the second display module; and a core plate disposed under the cover window and configured to receive the first display module, the second display module, and the heat-dissipating plate thereon, wherein a heat-dissipating plate includes: a first flat portion attached to the first display module; a second flat portion attached to the second display module; and a bridge connecting the first flat portion and the second flat portion to each other and having a shape different from a shape of each of the first flat portion and the second flat portion.

In some implementations of the first aspect, the bridge has a step structure bent toward the cover window from the first flat portion and the second flat portion, and wherein the bridge has a plurality of through-holes defined therein.

In some implementations of the first aspect, a light-blocking layer is disposed on the lower surface of the cover window and between the first display module and the second display module, wherein the bridge of the heat-dissipating plate vertically overlaps the light-blocking layer.

In some implementations of the first aspect, the core plate includes a protrusion supporting the bridge of the heat-dissipating plate.

In some implementations of the first aspect, a portion other than the protrusion of the core plate is spaced apart from the heat-dissipating plate to form an air gap defined between the portion and the heat-dissipating plate.

In some implementations of the first aspect, each of the first display module and the second display module includes: a display panel; and a support plate attached to a lower surface of the display panel, wherein the heat-dissipating plate is attached to the support plate.

In some implementations of the first aspect, the display panel is embodied as an organic light-emitting diode display panel.

In some implementations of the first aspect, each of the heat-dissipating plate and the core plate is made of metal.

A second aspect of the present disclosure provides a display device comprising: a plurality of display modules, each including a display panel and a support plate disposed under the display panel; and a heat-dissipating plate attached to the support plates of the plurality of display module, wherein the heat-dissipating plate includes: flat portions respectively attached to the plurality of display modules; and at least one bridge connecting adjacent ones of the flat portions to each other, wherein the at least one bridge is bent from the flat portions to form a step structure.

In some implementations of the second aspect, the at least one bridge has a plurality of through-holes defined therein.

In some implementations of the second aspect, the display device further comprises a core plate configured to receive thereon the plurality of display modules and the heat-dissipating plate, wherein the core plate includes a protrusion supporting the bridge of the heat-dissipating plate thereon.

In some implementations of the second aspect, the display device further comprises: a cover windows disposed on the plurality of display modules; and a light-blocking layer disposed on a lower surface of the cover window and between adjacent ones of the plurality of display modules, wherein the at least one bridge of the heat-dissipating plate overlaps the light-blocking layer.

Although the aspects of the present disclosure have been described in more detail with reference to the accompanying drawings, the present disclosure is not necessarily limited to these aspects, and may be modified in a various manner within the scope of the technical spirit of the present disclosure. Accordingly, the aspects as disclosed in the present disclosure are intended to describe rather than limit the technical idea of the present disclosure, and the scope of the technical idea of the present disclosure is not limited by these aspects. Therefore, it should be understood that the aspects described above are not restrictive but illustrative in all respects. The scope of protection of the present disclosure should be interpreted according to the scope of claims, and all technical ideas within an equivalent scope thereto should be interpreted as being included in the scope of rights of the present disclosure.

What is claimed is:

1. A display device comprising:

a cover window;

a first display module and a second display module attached to a lower surface of the cover window;

a heat-dissipating plate attached to the first display module and the second display module; and a core plate disposed under the cover window and configured to receive the first display module, the second display module, and the heat-dissipating plate thereon, wherein a heat-dissipating plate includes:

a first flat portion attached to the first display module;

a second flat portion attached to the second display module; and a bridge connecting the first flat portion and the second flat portion to each other and having a shape different from a shape of each of the first flat portion and the second flat portion, wherein the bridge has a step structure bent toward the cover window from the first flat portion and the second flat portion, and wherein the bridge has a plurality of through-holes defined therein.

2. The display device of claim 1, wherein a light-blocking layer is disposed on the lower surface of the cover window and between the first display module and the second display module, and wherein the bridge of the heat-dissipating plate vertically overlaps the light-blocking layer.

3. The display device of claim 1, wherein the core plate includes a protrusion supporting the bridge of the heat-dissipating plate.

4. The display device of claim 3, wherein a portion other than the protrusion of the core plate is spaced apart from the heat-dissipating plate to form an air gap defined between the portion and the heat-dissipating plate.

5. The display device of claim 1, wherein each of the first display module and the second display module includes:

a display panel; and a support plate attached to a lower surface of the display panel, wherein the heat-dissipating plate is attached to the support plate.

6. The display device of claim 5, wherein the display panel is embodied as an organic light-emitting diode display panel.

7. The display device of claim 1, wherein each of the heat-dissipating plate and the core plate is made of metal.

8. A display device comprising:

a plurality of display modules, each including a display panel and a support plate disposed under the display panel; and a heat-dissipating plate attached to the support plates of the plurality of display module, wherein the heat-dissipating plate includes:

flat portions respectively attached to the plurality of display modules; and at least one bridge connecting adjacent ones of the flat portions to each other, wherein the at least one bridge is bent from the flat portions to form a step structure, and wherein the at least one bridge has a plurality of through-holes defined therein.

9. The display device of claim 8, wherein the display device further comprises a core plate configured to receive thereon the plurality of display modules and the heat-dissipating plate, and wherein the core plate includes a protrusion supporting the bridge of the heat-dissipating plate thereon.

10. The display device of claim 8, wherein the display device further comprises:

a cover windows disposed on the plurality of display modules; and a light-blocking layer disposed on a lower surface of the cover window and between adjacent ones of the plurality of display modules, wherein the at least one bridge of the heat-dissipating plate overlaps the light-blocking layer.

11. A display device comprising:

a cover window;

a first display module and a second display module attached to a lower surface of the cover window;

a heat-dissipating plate attached to a lower surface of the first display module and a lower surface of the second display module; and wherein a heat-dissipating plate includes:

a first flat portion attached to the first display module;

a second flat portion attached to the second display module; and a bridge connecting the first flat portion and the second flat portion to each other and having a shape different from a shape of each of the first flat portion and the second flat portion, wherein the bridge is formed with a plurality of through-holes extending in a width direction of the bridge.

12. The display device of claim 11, further comprising a core plate disposed under the cover window and configured to receive the first display module, the second display module, and the heat-dissipating plate thereon.

13. The display device of claim 11, wherein the bridge has a step structure bent toward the cover window from the first flat portion and the second flat portion.

14. The display device of claim 11, wherein the first flat portion, the second flat portion are integrally formed by patterning a single metal plate.

* * * * *